United States Patent
Cao

(10) Patent No.: US 11,854,595 B2
(45) Date of Patent: Dec. 26, 2023

(54) REFRESH CIRCUIT AND MEMORY

(71) Applicant: CHANGXIN MEMORY TECHNOLOGIES, INC., Hefei (CN)

(72) Inventor: Xianlei Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 241 days.

(21) Appl. No.: 17/453,877

(22) Filed: Nov. 8, 2021

(65) Prior Publication Data

US 2022/0293160 A1 Sep. 15, 2022

Related U.S. Application Data

(63) Continuation of application No. PCT/CN2021/105218, filed on Jul. 8, 2021.

(30) Foreign Application Priority Data

Mar. 15, 2021 (CN) .......................... 202110277829.6

(51) Int. Cl.
*G11C 11/04* (2006.01)
*G11C 11/406* (2006.01)
*G11C 11/408* (2006.01)

(52) U.S. Cl.
CPC ........ *G11C 11/406* (2013.01); *G11C 11/4085* (2013.01)

(58) Field of Classification Search
CPC .......................... G11C 11/406; G11C 11/4085
See application file for complete search history.

(56) References Cited

U.S. PATENT DOCUMENTS

| 9,336,852 B2 | 5/2016 | Lim et al. |
| 9,570,143 B2 | 2/2017 | Lim et al. |
| 9,978,440 B2 | 5/2018 | Cho |

(Continued)

FOREIGN PATENT DOCUMENTS

| CN | 104795097 A | 7/2015 |
| CN | 106128498 A | 11/2016 |

(Continued)

OTHER PUBLICATIONS

International Search Report cited in PCT/CN2021/107433, dated Dec. 15, 2021, 11 pages.

(Continued)

*Primary Examiner* — Pho M Luu
(74) *Attorney, Agent, or Firm* — Cooper Legal Group, LLC

(57) ABSTRACT

A refresh circuit and a memory. The refresh circuit includes: a row hammer address generation module, configured to receive a row activate command, a precharge command, and a single row address corresponding to the row activate command, and output a row hammer address corresponding to the single row address, where each of the single row addresses corresponds to a word line, the row activate command is configured to activate a word line pointed to by the single row address, and the precharge command is configured to inactivate the word line; and output the row hammer address if a single activation time of the word line is greater than a preset time; and a signal selector, configured to receive the row hammer address and a regular refresh address, and at least output the row hammer address.

16 Claims, 1 Drawing Sheet

(56) References Cited

U.S. PATENT DOCUMENTS

| | | |
|---|---|---|
| 10,811,077 B2 | 10/2020 | Shin et al. |
| 10,818,336 B2 | 10/2020 | Alzheimer |
| 10,860,222 B2 | 12/2020 | Shin et al. |
| 10,861,530 B2 | 12/2020 | Yamada et al. |
| 10,950,288 B2 | 3/2021 | Nale et al. |
| 2015/0243338 A1 | 8/2015 | Sohn et al. |
| 2016/0099043 A1 | 4/2016 | Tu |
| 2018/0005690 A1 | 1/2018 | Morgan et al. |
| 2019/0066759 A1 | 2/2019 | Nale |
| 2022/0270669 A1* | 8/2022 | Fan .................. G11C 16/14 |
| 2022/0293161 A1* | 9/2022 | Cao ................ G11C 11/40603 |
| 2023/0154518 A1* | 5/2023 | Kim ................ G11C 11/40615 |
| | | 365/222 |

FOREIGN PATENT DOCUMENTS

| | | |
|---|---|---|
| CN | 108885892 A | 11/2018 |
| CN | 110473577 A | 11/2019 |
| CN | 110491430 A | 11/2019 |
| CN | 111145806 A | 5/2020 |
| CN | 111755047 A | 10/2020 |
| CN | 112767983 A | 5/2021 |
| CN | 112786087 A | 5/2021 |
| WO | 2016083865 A1 | 6/2016 |

OTHER PUBLICATIONS

International Search Report cited in PCT/CN2021/120355, dated Dec. 9, 2021, 9 pages.
International Search Report cited in PCT/CN2021/105218, dated Dec. 15, 2021, 10 pages.

* cited by examiner

REFRESH CIRCUIT AND MEMORY

CROSS-REFERENCE TO RELATED APPLICATIONS

This is a continuation of International Application No. PCT/CN2021/105218, filed on Jul. 8, 2021, which claims the priority to Chinese Patent Application No. 202110277829.6, titled "REFRESH CIRCUIT AND MEMORY", filed with China National Intellectual Property Administration (CNIPA) on Mar. 15, 2021. The entire contents of International Application No. PCT/CN2021/105218 and Chinese Patent Application No. 202110277829.6 are incorporated herein by reference.

TECHNICAL FIELD

The present disclosure relates to, but is not limited to, a refresh circuit and a memory.

BACKGROUND

As density of semiconductor storage devices continues to increase, memory cells show characteristics of reduced physical size, reduced storage charges, and reduced noise tolerance. Electromagnetic interaction between the memory cells has an increased impact on the memory cells, and a possibility of data loss in the memory cells increase.

An extremely long single activation time of a single row address in a memory cell may cause a discharge rate of a capacitor at an adjacent address (generally referred to as a "row hammer address") to be higher than a natural discharge rate, and further causes data loss in the capacitor at the adjacent address due to excessive charge loss before a refresh signal arrives. Such a case is generally referred to as a "row hammer effect". In order to suppress the row hammer effect, a refresh operation needs to be performed on the row hammer address in a timely manner, to replenish charges and avoid errors in storage data.

SUMMARY

An overview of the subject matter detailed in the present disclosure is provided below, which is not intended to limit the protection scope of the claims.

An embodiment of the present disclosure provides a refresh circuit, including: a row hammer address generation module, configured to receive a row activate command, a precharge command, and a single row address corresponding to the row activate command, and output a row hammer address corresponding to the single row address, where each of the single row addresses corresponds to a word line, the row activate command is configured to activate a word line pointed to by the single row address, and the precharge command is configured to inactivate the word line; and output the row hammer address if a single activation time of the word line is greater than a preset time; and a signal selector, configured to receive the row hammer address and a regular refresh address, and at least output the row hammer address, wherein the row hammer address and the regular refresh address output by the signal selector are used as a refresh object corresponding to a refresh command.

An embodiment of the present disclosure further provides a memory, including the refresh circuit described above.

Other aspects of the present disclosure are understandable upon reading and understanding of the drawings and detailed description.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following descriptions are some rather than all of the embodiments of the present disclosure. Those skilled in the art may derive other drawings based on these drawings without creative efforts.

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

The embodiments of the present disclosure are described in detail below with reference to the accompanying drawings. However, those skilled in the art can understand that many technical details are proposed in the embodiments of the present disclosure to help readers better understand the present disclosure. However, even without these technical details and various changes and modifications made based on the following embodiments, the technical solutions claimed in the present disclosure can still be realized.

Figure 1:
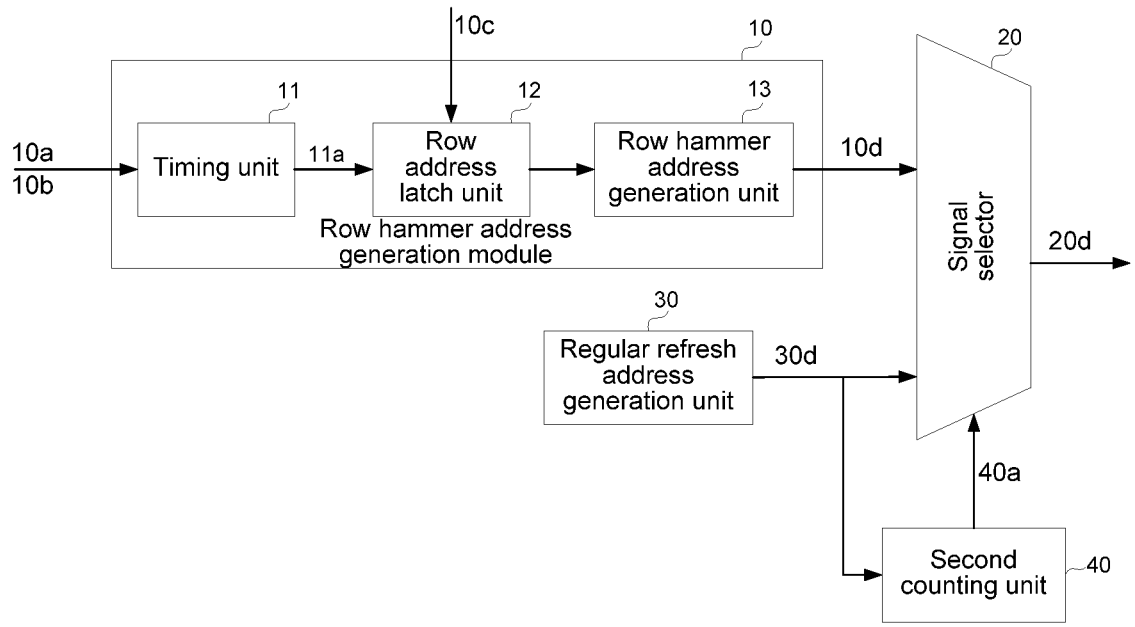
FIG. 1 is a schematic diagram of a functional structure of a refresh circuit according to an embodiment of the present disclosure.

Referring to FIG. 1, a refresh circuit includes: a row hammer address generation module 10, configured to receive a row activate command 10a, a precharge command 10b, and a single row address 10c corresponding to the row activate command 10a, and output a row hammer address 10d corresponding to the single row address 10c, where each single row address 10c corresponds to one word line, the row activate command 10a is configured to activate a word line pointed to by the single row address 10c, and the precharge command 10b is configured to inactivate the word line; and output the row hammer address 10d if a single activation time of the word line is greater than a preset time; and a signal selector 20, configured to receive the row hammer address 10d and a regular refresh address 30d, and at least output the row hammer address 10d, where the row hammer address 10d and the regular refresh address 30d output by the signal selector 20 are used as a refresh object corresponding to a refresh command.

The row hammer address generation module 10 is configured to receive a plurality of different single row addresses 10c. When the single row address 10c received by the row hammer address generation module 10 changes, the word line pointed to by the single row address 10c changes accordingly, and the row activate command 10a and the precharge command 10b configured to activate and inactivate the word line, respectively, change accordingly. The signal selector 20 outputs the row hammer address 10d or the regular refresh address 30d when the refresh command arrives, and each refresh command corresponds to a preset quantity of rows to be refreshed. In other words, under excitation of a refresh command, the signal selector 20 can output a preset quantity of addresses to be refreshed, and the address to be refreshed is the row hammer address 10d or the regular refresh address 30d. A value of the "preset quantity" may vary with an application environment of the refresh circuit. In the following description, for example, the preset quantity is m.

Each row activate command 10a and each precharge command 10b correspond to a specific word line, and a single activation duration of the specific word line can be determined based on a reception time interval of each of the row activate command 10a and the precharge command 10b corresponding to the specific word line. A value of the preset time is related to performance of a memory, and specifically, related to storage charges of a capacitor and a discharge rate of the capacitor under a row hammer effect. More storage charges or a lower discharge rate of the capacitor under the row hammer effect indicate or indicates a longer single activation time bearable by the specific word line and a larger threshold range for which the preset time can be set.

The row hammer address 10d is an adjacent address of the single row address 10c. If the single row address 10c is m, and m is a positive integer, the row hammer address 10d includes a first single row address and a second single row address, wherein the first single row address is m−1, and the second single row address is m+1. The row hammer address 10d is a collective term for adjacent addresses, in a unit of "group", and a group of row hammer address 10d may include one or more adjacent addresses of a single row address 10c. In some embodiments, the row hammer address includes only m+1 or m−1, or further includes at least one of m+2 or m−2.

The present disclosure focuses on a function of the refresh circuit after the row hammer address 10d is received, that is, at least the row hammer address 10d is output to preferentially refresh the row hammer address 10d. Regarding a function of the refresh circuit before the row hammer address 10d is received, that is, refreshing performed based on a default refresh sequence of the regular refresh address, only brief description is provided herein as it belongs to content already known to those skilled in the art.

In this embodiment, the row hammer address generation module 10 includes: a timing unit 11, configured to receive the row activate command 10a and the precharge command 10b, to obtain the single activation time, and output a timeout signal 11a if the single activation time is greater than the preset time; a row address latch unit 12, configured to receive the single row address 10c and connect to an output terminal of the timing unit 11, and latch and output the single row address 10c if receiving the timeout signal 11a; and a row hammer address generation unit 13, configured to receive the single row address 10c output by the row address latch unit 12, and output the row hammer address 10d corresponding to the single row address 10c.

In this embodiment, detailed description is provided by using an example in which the signal selector 20 receives only a latest generated group of row hammer address 10d before the refresh command arrives, and the latest generated group of row hammer address 10d may include one or more adjacent addresses. In other embodiments, the signal selector receives earliest generated one or more groups of row hammer address, or receives row hammer addresses corresponding to all single row addresses output by the row address latch unit.

The row address latch unit 12 is configured to receive a plurality of different single row addresses 10c, and a single activation time of a word line pointed to by each single row address 10c may be greater than the preset time. Therefore, the row address latch unit 12 may need to latch and output a plurality of single row addresses 10c.

In this embodiment, the row address latch unit 12 is configured to sequentially output a single row address 10c corresponding to each timeout signal 11a, and replace a single row address 10c output earlier with a single row address 10c output later; and the row hammer address generation unit 13 is configured to sequentially output the row hammer address 10d corresponding to each received single row address 10c, and replace the row hammer address 10d output earlier with the row hammer address 10d output later. In this way, before the refresh command arrives, the row hammer address generation unit 13 may output only a latest generated group of row hammer address 10d, and the signal selector 20 receives only the latest generated group of row hammer address 10d, such that when the refresh command arrives, the signal selector 20 outputs only the latest generated group of row hammer address 10d.

In other embodiments, after receiving the timeout signal, the row address latch unit outputs all single row addresses corresponding to all timeout signals that have been received, or the row address latch unit sequentially outputs a single row address corresponding to each timeout signal and the row hammer address generation unit has a storage function, or the row address latch unit sequentially outputs a single row address corresponding to each timeout signal and the signal selector has a storage function. In this way, the row hammer address generation unit can receive all the single row addresses and output row hammer addresses corresponding to all the single row addresses, and the signal selector can receive the row hammer addresses corresponding to all the single row addresses, so as to output the row hammer addresses corresponding to all the single row addresses when the refresh command arrives.

A restriction condition can be added, such that when the refresh command arrives, the signal selector outputs only x groups of row hammer address corresponding to x single row addresses, where x is a positive integer. The restriction condition may be any one of the following: first, restricting a latch capability or an output capability of the row address latch unit, such that the row address latch unit can latch and output only x single row addresses, and cannot latch or output an (x+1)th single row address; second, restricting a storage capability or an output capability of the row hammer address generation unit, such that the row hammer address generation unit can store and output only x groups of row hammer address, and cannot store an (x+1)th single row address or cannot output an (x+1)th group of row hammer address; third, restricting a storage capability of the signal selector, such that the signal selector can store only x−1 groups of row hammer address, and in addition to the already stored x−1 groups of row hammer address, based on a rule that a row hammer address output later replaces a row hammer address output earlier, when the refresh command arrives, the signal selector can receive only a latest generated group of row hammer address, and then output a total of x groups of row hammer address including the first x−1 groups of row hammer address and the last group of row hammer address.

Figure 2:
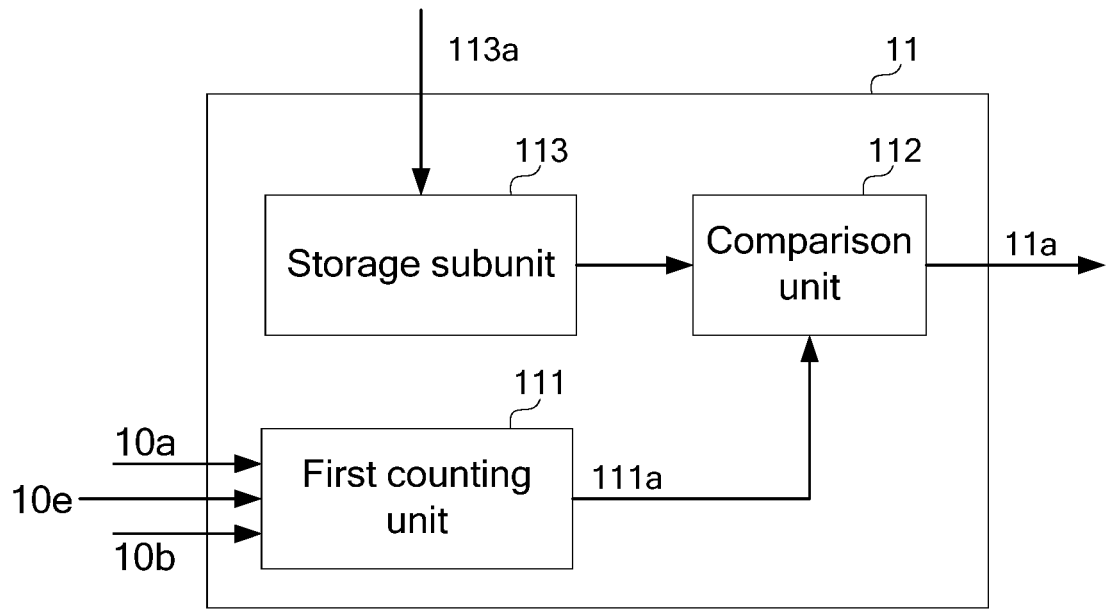
FIG. 2 is a schematic diagram of a functional structure of a timing unit in the refresh circuit shown in FIG. 1.

In this embodiment, referring to FIG. 2, the timing unit 11 includes: a first counting unit 111, configured to receive the row activate command 10a, the precharge command 10b, and a clock signal 10e, and count a quantity of periods of the received clock signal 10e after receiving the row activate command 10a and before receiving the precharge command 10b, and output a first count value 111a; and a comparison unit 112, configured to receive the first count value 111a, and output the timeout signal 11a if the first count value 111a is greater than a preset count value, where the preset count value is equal to the preset time divided by a period of the clock signal 10e.

The clock signal 10e is a periodic internal clock signal, and a period of the clock signal 10e in a different memory may be different. When the preset time remains unchanged, a preset count value of a refresh circuit applied to a different memory may be different. In addition, the first counting unit 111 may be an asynchronous binary addition counter including a plurality of D flip-flops connected in series, for counting the quantity of periods of the clock signal 10e.

In this embodiment, the timing unit 11 further includes: a storage subunit 113, configured to write and store the preset count value 113a, where an output terminal of the storage subunit 113 is connected to an input terminal of the comparison unit 112, and the comparison unit 112 is configured to obtain the preset count value 113a through the storage subunit 113. The preset count value 113a stored in the storage subunit 113 may be updated by writing a new preset count value 113a, such that the preset count value 113a has a feature of adjustability.

In other embodiments, the comparison unit stores a fixed preset count value. The preset count value may vary with different refresh circuits, to be applied to different types of memories.

In this embodiment, based on a case that the signal selector 20 receives only the last generated group of row hammer address 10d and the last group of row hammer address 10d includes only two adjacent addresses, that the signal selector 20 first outputs n−2 regular refresh address 30d and then outputs two adjacent addresses is used as an actual output manner for exemplary description.

In other embodiments, an actual output manner of the signal selector is: receiving and outputting each regular refresh address before receiving the row hammer address; if receiving the row hammer address, stopping outputting the regular refresh address, and outputting each received row hammer address; and after outputting the row hammer address, continuing to receive and output each regular refresh address.

In this embodiment, the signal selector 20 is further configured to receive a selection signal 40a, and sequentially receive and output each regular refresh address 30d before receiving the selection signal 40a, stop outputting the regular refresh address 30d after receiving the selection signal 40a, and sequentially receive and output each row hammer address 10d. The selection signal 40a represents that the signal selector 20 has received n−2 regular refresh address 30d, n is a quantity of rows to be refreshed corresponding to each refresh command, and n>2.

In other embodiments, the selection signal represents that the signal selector has received n-k regular refresh address, n>k, and k is obtained by multiplying a quantity of groups of row hammer address output by the signal selector by a quantity of adjacent address included in each group of row hammer address.

In this embodiment, the refresh circuit further includes: a second counting unit 40, configured to count a quantity of regular refresh address 30d received by the signal selector 20, to obtain a second count value, and output the selection signal 40a if the second count value is equal to n−2.

The selection signal 40a is an identification signal output by the second counting unit 40, and is used to switch between switches for the signal selector 20 to receive row address information, such that a path between the signal selector 20 and a regular refresh address generation unit 30 is disabled, and a path between the signal selector 20 and the row hammer address generation unit 13 is enabled, for receiving and outputting the row hammer address 10d. In addition, the identification signal may be the second count value.

In this embodiment, after outputting the regular refresh address 30d and the row hammer address 10d, or to be precise, after outputting n−2 regular refresh address 30d and a group of row hammer address 10d, the signal selector 20 resets the second count value, and stops outputting the selection signal 40a, to wait for a next refresh command to arrive, such that the foregoing output step is repeated, that is, n−2 regular refresh address 30d are output first, and then a group of row hammer address 10d is output.

In this embodiment, the second counting unit 40 is further configured to write and update a value of n−2, and after updating the value of n−2, output the selection signal 40a if the second count value is equal to updated n−2. This helps update the value of n−2 in a timely manner according to a policy of outputting the row hammer address 10d by the signal selector 20, thereby ensuring that the refresh of the row hammer address 10d can be completed within a quantity of rows to be refreshed corresponding to the refresh command, or a quantity of rows to be refreshed corresponding to the refresh command can be all used for the refresh of the row hammer address 10d.

In this embodiment, the refresh circuit further includes: the regular refresh address generation unit 30, configured to generate and output at least one regular refresh address 30d, wherein an output terminal of the regular refresh address generation unit 30 is connected to an input terminal of the signal selector 20 and an input terminal of the second counting unit 40, and the second counting unit 40 is configured to receive the at least one regular refresh address 30d output by the regular refresh address generation unit 30.

In this embodiment, when a row hammer address and a regular refresh address are received, at least the row hammer address is output, and there is no need to sequentially perform refresh operations based on a default refresh sequence of the regular refresh address, such that the row hammer address can be preferentially refreshed, and a capacitor corresponding to the row hammer address can be prevented from suffering from data loss due to excessive charge loss before a refresh signal arrives, thereby ensuring data storage accuracy.

Correspondingly, an embodiment of the present disclosure further provides a memory, including the refresh circuit described above. The memory can preferentially refresh a row hammer address, to prevent a capacitor corresponding to the row hammer address from suffering from data loss due to excessive charge loss before a refresh signal arrives, thereby ensuring data storage accuracy of the memory.

Those skilled in the art can understand that the above implementations are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims. In the descriptions of this specification, a description with reference to terms such as "an embodiment", "an exemplary embodiment", "some implementations", "an exemplary implementation" and "an example" means that the specific feature, structure, material or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the descriptions of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the refresh circuit and the memory provided in the embodiments of the present disclosure, when a row hammer address and a regular refresh address are received, at least the row hammer address is output, and there is no need to sequentially perform refresh operations based on a default refresh sequence of the regular refresh address, such that the row hammer address can be preferentially refreshed, and a capacitor corresponding to the row hammer address can be prevented from suffering from data loss due to excessive charge loss before a refresh signal arrives, thereby ensuring data storage accuracy.

The invention claimed is:

1. A refresh circuit, comprising:
    a row hammer address generation module, configured to receive a row activate command, a precharge command, and a single row address corresponding to the row activate command, and output a row hammer address corresponding to the single row address, wherein each of the single row addresses corresponds to a word line, the row activate command is configured to activate a word line pointed to by the single row address, and the precharge command is configured to inactivate the word line; and output the row hammer address if a single activation time of the word line is greater than a preset time; and
    a signal selector, configured to receive the row hammer address and a regular refresh address, and at least output the row hammer address, wherein the row hammer address and the regular refresh address output by the signal selector are used as a refresh object corresponding to a refresh command.

2. The refresh circuit according to claim 1, wherein the single row address is m, and the m is a positive integer; the row hammer address comprises: a first single row address, the first single row address being m−1; a second single row address, the second single row address being m+1.

3. The refresh circuit according to claim 1, wherein the row hammer address generation module comprises:
    a timing unit, configured to receive the row activate command and the precharge command, to obtain the single activation time, and output a timeout signal if the single activation time is greater than the preset time;
    a row address latch unit, configured to receive the single row address and connect to an output terminal of the timing unit, and latch and output the single row address if receiving the timeout signal; and
    a row hammer address generation unit, configured to receive the single row address output by the row address latch unit, and output the row hammer address corresponding to the single row address.

4. The refresh circuit according to claim 3, wherein the row address latch unit is configured to sequentially output the single row address corresponding to each of the timeout signals, and replace the single row address output earlier with the single row address output later; and the row hammer address generation unit is configured to sequentially output the row hammer address corresponding to each of the received single row addresses, and replace the row hammer address output earlier with the row hammer address output later.

5. The refresh circuit according to claim 3, wherein the timing unit comprises:
    a first counting unit, configured to receive the row activate command, the precharge command, and a clock signal, and count a quantity of periods of the received clock signal after receiving the row activate command and before receiving the precharge command, and output a first count value; and
    a comparison unit, configured to receive the first count value, and output the timeout signal if the first count value is greater than a preset count value, wherein the preset count value is equal to the preset time divided by the period of the clock signal.

6. The refresh circuit according to claim 5, wherein the first counting unit comprises an asynchronous binary addition counter composed of a plurality of D flip-flops connected in series.

7. The refresh circuit according to claim 5, the timing unit further comprising: a storage subunit, configured to write and store the preset count value, wherein an output terminal of the storage subunit is connected to an input terminal of the comparison unit, and the comparison unit is further configured to obtain the preset count value through the storage subunit.

8. The refresh circuit according to claim 7, wherein the preset count value is adjustable.

9. The refresh circuit according to claim 5, wherein the preset count value is adjustable.

10. The refresh circuit according to claim 1, wherein the signal selector is further configured to receive a selection signal, sequentially receive and output each of the regular refresh addresses before receiving the selection signal, stop outputting the regular refresh address after receiving the selection signal, and sequentially receive and output each of the row hammer addresses; wherein the selection signal represents that the signal selector has received n−2 regular refresh address, the n is a quantity of rows to be refreshed corresponding to each of the refresh commands, and the n>2.

11. The refresh circuit according to claim 10, the refresh circuit further comprising: a second counting unit, configured to count a quantity of the regular refresh address received by the signal selector, to obtain a second count value, and output the selection signal if the second count value is equal to the n−2.

12. The refresh circuit according to claim 11, after outputting the regular refresh address and the row hammer address, the signal selector resets the second count value and stops outputting the selection signal.

13. The refresh circuit according to claim 11, wherein the second counting unit is further configured to write and update a value of the n−2, and output the selection signal if the second count value is equal to the updated n−2.

14. The refresh circuit according to claim 11, further comprising: a regular refresh address generation unit, configured to generate and output at least one of the regular refresh addresses, wherein an output terminal of the regular refresh address generation unit is connected to an input terminal of the signal selector and an input terminal of the second counting unit, and the second counting unit is configured to receive the at least one of the regular refresh addresses output by the regular refresh address generation unit.

15. The refresh circuit according to claim 1, wherein the signal selector receives and outputs each of the regular refresh addresses before receiving the row hammer address; if receiving the row hammer address, the signal selector stops outputting the regular refresh address, and outputs each of the received row hammer addresses; and after outputting the row hammer address, the signal selector continues to receive and output each of the regular refresh addresses.

16. A memory, comprising the refresh circuit according to claim 1.

* * * * *